Sept. 15, 1970 J. S. CRABBE 3,529,256

INTEGRATED BAND-PASS FILTER

Original Filed June 30, 1966

INVENTOR:
JAMES S. CRABBE

E. Mickey Hubbard
ATTORNEY

United States Patent Office 3,529,256

Patented Sept. 15, 1970

3,529,256

INTEGRATED BAND-PASS FILTER

James S. Crabbe, Richardson, Tex., assignor to Texas Instruments Incorporated, Dallas, Tex., a corporation of Delaware Continuation of application Ser. No. 561,986, June 30, 1966. This application Oct. 7, 1968, Ser. No. 802,302
Int. Cl. H03f 3/04
U.S. Cl. 330—24 8 Claims

ABSTRACT OF THE DISCLOSURE

Disclosed is a band-pass filter which includes an integrated circuit amplifier formed in a common semiconductor substrate and a notch filter connected in a feed back relationship with the amplifier to form the band-pass filter.

This application is a continuation of Ser. No. 561,986, filed June 30, 1966, now abandoned.

This invention relates generally to band-pass filters, and more particularly relates to an integrated active band-pass filter and to the method of fabricating such a filter.

Although there is considerable need for a band-pass filter in integrated circuit form, it is believed that no such practical filter has heretofore been successfully achieved. Attempts to fabricate such a filter have included the use of ceramic devices which are mechanically resonant, various digital approaches, and various active element circuits. However, these devices have not been successful for various reasons. One of the reasons integrated band-pass filters have not heretofore been successful is that the values of the various resistors and other components cannot be maintained by existing technology within the tolerance necessary to produce a filter having the desired center frequency and Q value.

Therefore, an important object of the present invention is to provide a band-pass filter in integrated circuit form.

Another object of the invention is to provide such a device wherein both the center frequency and Q value can be adjusted over a significant range with a fine tuning capability.

Another object is to provide such a device which will operate over a wide range of supply voltages without changing the center frequency or Q value.

Another object is to provide an integrated band-pass filter having good temperature stability.

Yet another object of the invention is to provide such a band-pass filter which can be cascaded with like devices to increase the amplitude of the pass-band frequencies.

Still another important object of the invention is to provide a method for fabricating an integrated band-pass filter with a selected center frequency and Q value.

These and other objects are accomplished in accordance with the present invention by utilizing a high gain inverting amplifier with a notch filter connected in a negative feedback path. The high gain amplifier is fabricated using diffused transistors, diodes, and resistors in a single integrated circuit chip. The notch filter is comprised of resistors and capacitors formed by thin films.

In accordance with one specific aspect of the invention, the amplifier is a differential amplifier having one input connected to a reference voltage. The reference voltage is established by maintaining a constant voltage through a diode means.

In accordance with another specific aspect of the invention, the notch filter is comprised of first and second resistances connected in series, and a third resistance connected to the input and output of the filter and to the junction between the first and second resistances by capacitors. The center frequency of the band-pass filter is adjustable by varying the values of the first and second resistances and the Q value is adjustable by varying the ratio of the third resistance to the values of the first and second resistances.

In accordance with still another aspect of the invention, a method for fabricating a filter is provided whereby the filter is fabricated on a common substrate using thin film techniques. The resistors are fabricated in short circuited sections. After the filter is tested, selected sections of the resistors are placed in the circuit by opening the short circuits and thereby select either the center frequency or the Q value of the filter, or both.

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

Figures 1, 2, 3:
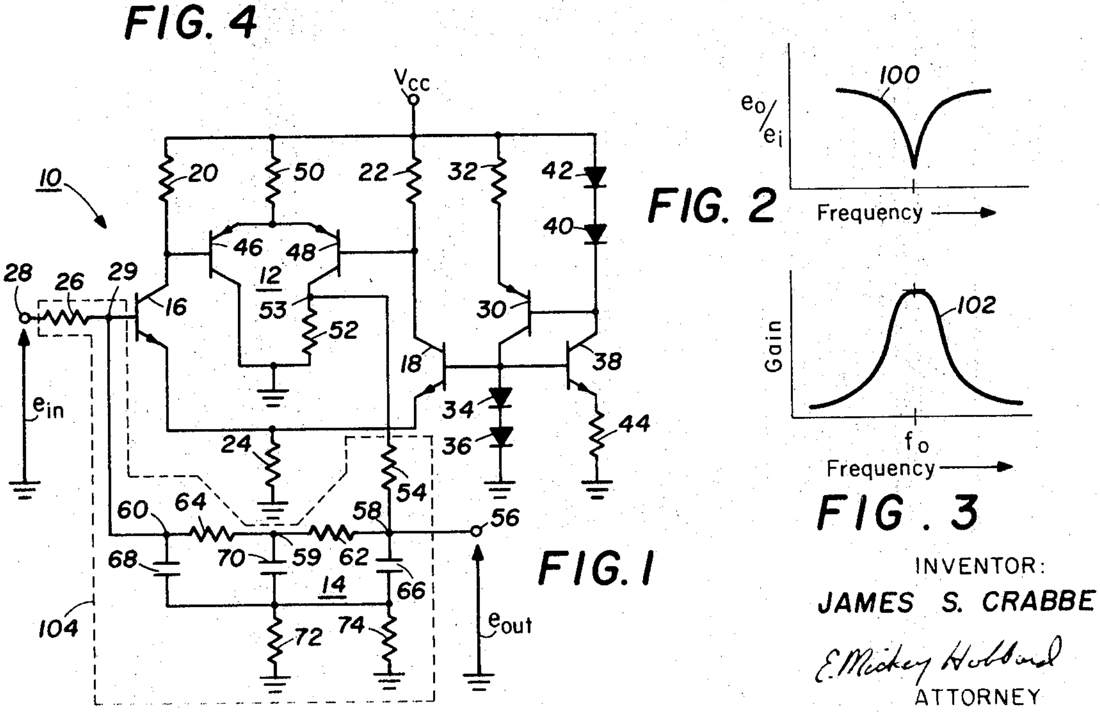
FIG. 1 is a schematic circuit diagram of a band-pass filter constructed in accordance with the present invention.
FIG. 2 is a plot illustrating the frequency response of the notch filter section illustrated in FIG. 1.
FIG. 3 is a plot illustrating the frequency response of the total circuit illustrated in FIG. 1.

Referring now to the drawings, and in particular to FIG. 1, a band-pass filter constructed in accordance with the present invention is indicated generally by the reference numeral 10. The band-pass filter 10 is comprised essentially of a two-stage, high gain, differential, inverting amplifier, indicated generally by the reference numeral 12, having a resistor-capacitor notch filter, indicated generally by the reference numeral 14, interconnecting the output and input of the amplifier to provide a feedback loop.

The amplifier 12 is comprised of a pair of differentially connected input transistors 16 and 18. The collectors of transistors 16 and 18 are connected through resistors 20 and 22, respectively, to the collector voltage supply. The emitters of transistors 16 and 18 are common and are connected to ground by resistor 24. The base 29 of transistor 16 is connected through an input resistor 26 to an input terminal 28.

The base of transistor 18 is maintained at a constant voltage level by maintaining a constant current through diodes 34 and 36. This is achieved by a constant current source comprised of transistors 30 and 38 and diodes 34, 36, 40 and 42. The emitter of transistor 30 is connected by resistor 32 to the collector voltage supply. The collector of transistor 30 is connected to the base of transistor 18, and is connected to ground by forward biased diodes 34 and 36. The base of a second transistor 38 is common with the base of transistor 18. The collector of transistor 38 is connected to the base of transistor 30 and is connected through forward biased diodes 40 and 42 to the collector voltage supply. The emitter is connected through resistor 44 to ground.

The collectors of transistors 16 and 18 drive the bases of second stage transistors 46 and 48 the emitters of which are common and are connected through resistor 50 to the collector voltage supply. The collector of transistor 46 is connected directly to ground, and the collector of transistor 48 is connected through a resistor 52 to ground so that an output voltage can be established across resistor 52 at junction 53. The collector of transistor 48 is connected through a resistor 54 to the input 58 of the notch filter 14 and then to an output terminal 56. The output 60 of the notch filter is connected back to the base of the input transistor 16. The notch filter 14 is of conventional circuit design and is comprised of resistors 62 and 64 connected in series at junction 59, and capacitors 66, 68 and 70 which couple the input 58, output 60, and the junction 59, respectively, to one terminal of parallel resistors 72 and 74 and thence to ground.

The potential at the base of transistor 18 is maintained substantially constant regardless of the level of the collector supply voltage by maintaining a constant current through diodes 34 and 36. This is achieved by maintaining a constant voltage drop across diodes 40 and 42, which in turn is achieved by maintaining a constant current through diodes 40 and 42 by means of transistor 38. The base-emitter voltage of transistor 38 is in turn controlled by the voltage drop across diodes 34 and 36. Further, because of the symmetry of the reference voltage system, variations and temperature have a minimal effect.

When the input 28 goes positive, transistor 16 begins to turn "on" and transistor 18 begins to turn "off," thus causing transistor 46 to begin to turn "on" and transistor 48 to begin to turn "off." As a result, the output 56 goes negative. The converse occurs when the input 28 goes negative. The differential configuration of the amplifier 12 reduces the coupling of the signal to the power supply. The complementary transistors used in the two stages reduce the effect of power supply voltage variations on the gain of the amplifier, and also permit the filter to be operated by a much lower power supply voltage. It is important that the amplifier 12 have a high gain and that the gain be stable because both the Q and center frequency of the band-pass filter 10 are dependent upon the stability of the amplifier gain.

The signal at the output 56 is fed back through the notch filter 14 to the base of transistor 16. The notch filter 14 is of conventional design and has a frequency response illustrated by the somewhat idealized curve 100 in FIG. 3. As a result of the notch filter feedback and the high gain of the amplifier, the frequency response of the total circuit 10 is represented by the idealized curve 102 in FIG. 4. The center or maximum amplitude frequency $f_0$ is determined by the combined magnitude of resistors 62 and 64, while the Q value of the circuit 10, which is defined as the maximum frequency $f_0$ divided by $\Delta f$ where $\Delta f$ is the frequency band between points on the curve 102 at a level three decibels below $f_0$. Thus, the center frequency and the Q value can be adjusted essentially independently as will now be described.

As previously mentioned, an important aspect of this invention is that the band-pass filter 10 is fabricated in integrated circuit form. More particularly, the portion of the circuit within the dotted outline in FIG. 1 is fabricated on a single silicon substrate 104 illustrated in FIG. 4. The remainder of the circuit including the amplifier 12 and its reference voltage circuit are fabricated by diffusion techniques on the same or a separate silicon substrate. Even if fabricated on two silicon substrates, the two substrates may easily be contained within a single standard integrated circuit package and interconnections between the two chips made using conventional ball bonding techniques.

Figure 4:
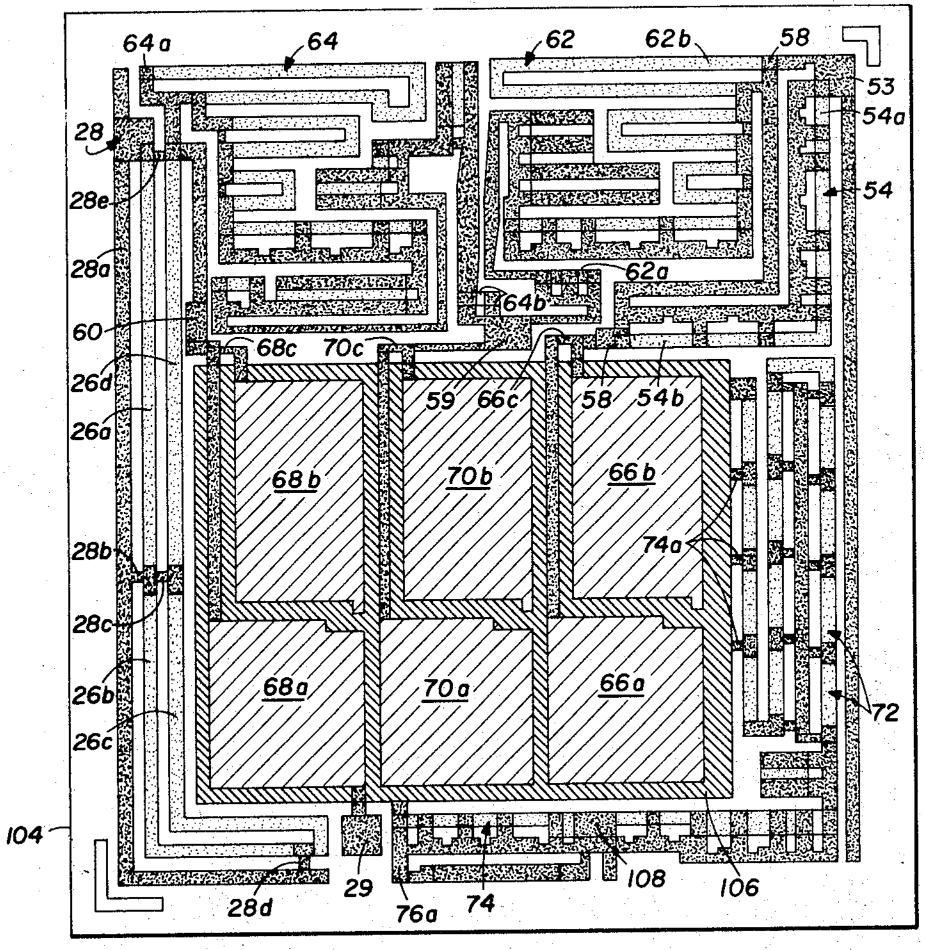
FIG. 4 is a plan view of the notch filter illustrated in FIG. 1 which also serves to illustrate the process of this invention.

Referring now to FIG. 4, each of the resistors and capacitors of the notch filter 14 is fabricated so that the resistance values can be selectively varied after the circuit is tested to permit the center frequency and Q value to be selectively adjusted. This is achieved by initially fabricating the resistors in short circuited sections so that when the short circuits are opened, the corresponding section of the circuit is placed in the circuit. For example, the input resistor 26 is fabricated in four section **26*a*–26*d*. The input terminal 28 is connected to a conductor 28*a* which extends parallel to the sections 26*a* and 26*b*, and parallel to sections 26*c* and 26*d*. The lead 28*a* is connected to the junction between sections 26*a* and 26*b* by a necked portion 28*b*, and to the junction between section 26*c* and 26*d* by a necked portion 28*c***. The portion

**28*a* is also connected to the junction between sections 26*b* and 26*c* by necked portion 28*d*, and the expanded contact portion 28 is connected to the end of section 26*a* directly, and to the end of section 26*d* by necked portion 28*e*. Thus, the value of the resistor 26 may be selected by burning out one or more or the necked portions 28*b*–28*e* to open the short circuit around one or more of the sections 26*α*–26*d*. This may be accomplished by applying probes to either side of the necked portions and discharging a capacitor through the necked portion so that the necked portion will be burned away and the short circuit opened. Thus, it will be noted that unless necked portion 28*e* is removed, the resistor 26 will be completely bypassed. If only necked portion 28*e* is removed, then only section 26*d* will be effective. If necked portions 28*e* and 28*c* are removed, then sections 26*c* and 26*d* will be placed in the circuit. By removing necked portion 28*d*, secton 26*b* will be added to the circuit, and by removing necked portion 28*b*, section 26*a* would be added. It will also be noted that the sections can be used in various parallel combinations to obtain further variations in the value of resistor 26**.

The various junctions on the circuit 10 illustrated in FIG. 1 are designated by the corresponding reference characters in FIG. 4. Each of the resistors 64, 62, 72, 74 and 54 is formed by short circuited sections and is variable over a wide range using the same technique described in connection with resistor 26. Thus, it will be noted that resistor 64 is formed from the lightly stippled sections beginning at point **64*a* and terminating at point 64*b* adjacent junction 59. It will be noted that each section is short circuited by a necked portion which, when burned away as heretofore described, places the section of the resistor in the circuit. Similarly, resistor 62 is comprised of a corresponding number of sections beginning at 62*a* and ending at 62*b* and extending between junctions 59 and 58. The junction 53 is connected to the output of the amplifier and resistor 54 is comprised of the number of sections, beginning with section 54*a* and ending with section 54*b*, between junctions 53 and 58**.

Two plates **66*a* and 66*b* are provided for capacitor 66, two plates 70*a* and 70*b* for capacitor 70 and two plates 68*a* and 68*b* for capacitor 68. The plates 66*b*, 68*b* and 70*b* may be removed from the circuit by opening the necked portions 66*c*, 70*c* and 68*c* using the the techniques heretofore described. The bottom plate of the three capacitors is the common plate 106 which is connected to ground 108 through either resistor 74 or resistor 76**.

Resistor 74 is made up of a plurality of sections extending from the plate 106 through any one of the necked portions **74*a* to the expanded contact 108 which is connected to ground. Resistor 76 extends from point 76*a* which is connected to the plate 106 to the expanded contact 108, and includes four sections which may be selectively included in the circuit by removing the necked portions of the shorting conductors as heretofore described. The expanded contact 29 is connected to capacitor 68 and thus to the input 28, and expanded contact 29 is connected to the base of transistor 16**.

Thus, it will be seen that the values of all of the resistors on the substrate 106 may be selectively varied after the circuit has been completely interconnected and tested in order to produce a band-pass filter having the desired center frequency and Q value. The center frequency of the filter is determined essentially by the RC product of the resistors and capacitors forming the notch filter. Thus, the value of resistors 62 and 64 may be varied to select the desired center frequency. The value of resistors 72 and 74 may then be selected to vary the ratio of the resistance of resistors 72 and 74 to resistors 62 and 64 and thereby achieve the desired Q value. The values of capacitors 66, 68 and 70 may be varied if desired in order to achieve significantly different ranges of center frequency and Q values, and also to provide two different levels of current to operate the amplifier.

If desired, additional sections of the capacitors may be provided to permit further selection of the center frequency. The value of resistor 54 may be varied in order to adjust the phase of the output of amplifier 12 in order to achieve proper operation of the band-pass filter.

From the foregoing description of a preferred embodiment of the invention, it will be appreciated that a novel and useful device has been described. By utilizing the combination of a high gain amplifier and a notch filter, both fabricated in integrated circuit form, an integrated circuit band-pass filter is achieved for the first time. Although the values of the resistors and capacitors of the notch filter 14 cannot be closely controlled using presently available fabrication techniques, the variable nature of the resistors and capacitors permits not only fine tuning after testing of the complete circuit, but also permits substantial variations in the selected center frequency and the Q values. The band-pass filter is stable over a substantial temperature range and is usable with voltage supplies which may vary over an appreciable range without significantly affecting the frequency response of the filter.

Although a preferred embodiment of the invention has been described in detail, it is to be understood that various changes, substitutions and alterations can be made therein without departing from the spirit and scope of the invention as defined by the appended claims.

What is claimed is:

1. A band-pass filter comprising a power supply, an inverting, high gain differential amplifier, including a plurality of active components formed by diffusion in a single semiconductor substrate, said amplifier having one input connected to a reference voltage, diode means connecting said input to ground for producing the reference voltage, means connected to diode means for maintaining a constant current through the diode means, said means for maintaining a constant current through the diode means including a first transistor the collector of which is connected to the diode means and the emitter of which is connectable to the power supply of the amplifier, second diode means interconnecting the power supply and the base of the first transistor, and a second transistor the collector of which is connected to the base of the first transistor and the emitter of which is connected through a resistance to ground, and a notch filter interconnecting the output and the input of the amplifier, the notch filter being comprised of thin film resistors and capacitors formed on said single substrate.

2. The band-pass filter defined in claim 1 wherein the notch filter comprises a plurality of first resistances each having a pair of terminals connected in series between the output and input of the amplifier, a second resistance having one terminal connected to ground, and a capacitor coupling each terminal of each of the first resistances to the other terminal of the second resistance.

3. The band-pass filter defined in claim 2 wherein the values of the first resistances can be selectively varied after the filter is connected and tested to permit adjustment of the center frequency of the filter.

4. The band-pass filter defined in claim 2, wherein the values of the second resistance can be selectively varied after the filter is connected and tested to permit adjustment of the Q value of the filter.

5. The band-pass filter defined in claim 3 wherein the resistances are fabricated in short circuited sections and can be adjusted by opening one or more of the short circuits.

6. The band-pass filter defined in claim 4 wherein the resistance is fabricated in short circuited sections and can be adjusted by opening one or more of the short circuits.

7. The band-pass filter defined in claim 2 wherein at least one of the capacitors can be selectively varied after the filter is connected and tested to permit adjustment of the center frequency of the filter.

8. The band-pass filter defined in claim 7 wherein one of the plates of the selectively variable capacitor is formed of a plurality of sections connected in parallel by a plurality of thin film paths which can be adjusted by opening one or more of the thin film paths.

References Cited

UNITED STATES PATENTS 3,233,196 2/1966 Osafune et al. ---- --333—70 X
3,383,612 5/1968 Harwood --------- 330—30 X ROY LAKE, Primary Examiner L. J. DAHL, Assistant Examiner U.S. Cl. X.R.

330—30, 38